United States Patent [19]

Imazeki et al.

[11] 4,427,904

[45] Jan. 24, 1984

[54] DIGITAL SIGNAL GENERATING CIRCUIT

[75] Inventors: Kazuyoshi Imazeki; Toshiyuki Tanaka, both of Tokyo, Japan

[73] Assignee: General Research of Electronics, Inc., Tokyo, Japan

[21] Appl. No.: 288,972

[22] Filed: Jul. 31, 1981

[30] Foreign Application Priority Data

Oct. 21, 1980 [JP] Japan ............................ 55-147075

[51] Int. Cl.[3] .................... H03K 13/00; H03K 19/08; H03K 19/092

[52] U.S. Cl. .................................. 307/463; 328/119

[58] Field of Search ...................... 307/464, 518, 463; 328/119

[56] References Cited

U.S. PATENT DOCUMENTS 3,011,075 11/1961 Tomlinson ......................... 307/464
3,155,839 11/1964 Modiano ............................ 307/464
3,433,978 3/1969 Bongenaar et al. ................ 307/464
4,042,915 8/1977 Reed ................................ 307/463

*Primary Examiner*—John S. Heyman
*Attorney, Agent, or Firm*—Trexler, Bushnell & Wolters, Ltd.

[57] ABSTRACT

A digital signal generating circuit having a control site, a remote digital signal generating site and a two-wire cable connecting said control site and said digital signal generating site. The control site produces various Zener diode trap voltages by switch state combinations. These trap voltages are transmitted to said digital signal generating site through said two-wire cable. A plurality of level sensing units are provided in said digital signal generating site. These level sensing units sense the respective levels of the transmitted trap voltages. A plurality of switching units are provided relating to the respective level sensing units, each for generating one of two logical outputs when the related sensing unit senses a predetermined trap level condition.

9 Claims, 3 Drawing Figures

DIGITAL SIGNAL GENERATING CIRCUIT

BACKGROUND OF THE INVENTION

This invention relates to a circuit for generating a digital signal, and, more particularly, to a circuit for generating a digital signal in a utilization position in response to a remote switch command.

There are many useful applications where a plurality of different digital signals must be transmitted to a remote utilization position. For example, in a multi-channel hand-held tranceiver system, a control unit adapted to be held by one hand is coupled by a cable to a separate tranceiver chassies. A channel scan system is provided. It includes two kinds of manual switches mounted in the control unit housing. When one switch is depressed, upward channel select is carried out, and when the other switch is depressed downward channel select is carried out. When two switches are depressed at the same time, the channel selection to the emergency channel is effected. The digital signals representing these operation commands are transmitted from the control unit through the cable to a channel select PLL circuit in the main chassies. In such a case that a plurality of the signal conditions are transmitted to the remote utilization position with relatively good S/N ratio, many problems occur. One of the most important problems is in the use of digital signal transmission lines, specifically if a multiconductor cable is used, the cost of the cable is increased. Further, when the digital signals are transmitted in level transition, the S/N ratio is deteriorated depending on the transmission characteristic of the cable.

SUMMARY OF THE INVENTION

This invention is aimed to remove such problems of the prior art system by generating in a control site or position a plurality of analogue signals of different levels, transmitting these analogue signals through a two-wire cable and converting them to a digital multi-state signal in a remote utilization position instead of generating in the control site the digital signal directly, thereby to decrease the number of the cable conductor lines. Also, there is needed no special consideration about the characteristic of the cable to be used for high S/N signal transmission.

BRIEF DESCRIPTION OF THE DRAWINGS

FIG. 1 shows one embodiment of this invention, which, in general, comprises a control site 10, a transmission cable 14 and a digital signal conversion site 12. The transmission site 10 to the conversion site 12 has a reference level line LE and a D.C. level carrying line LC. The reference level line LE is shown connected to the ground.

Figure 1:
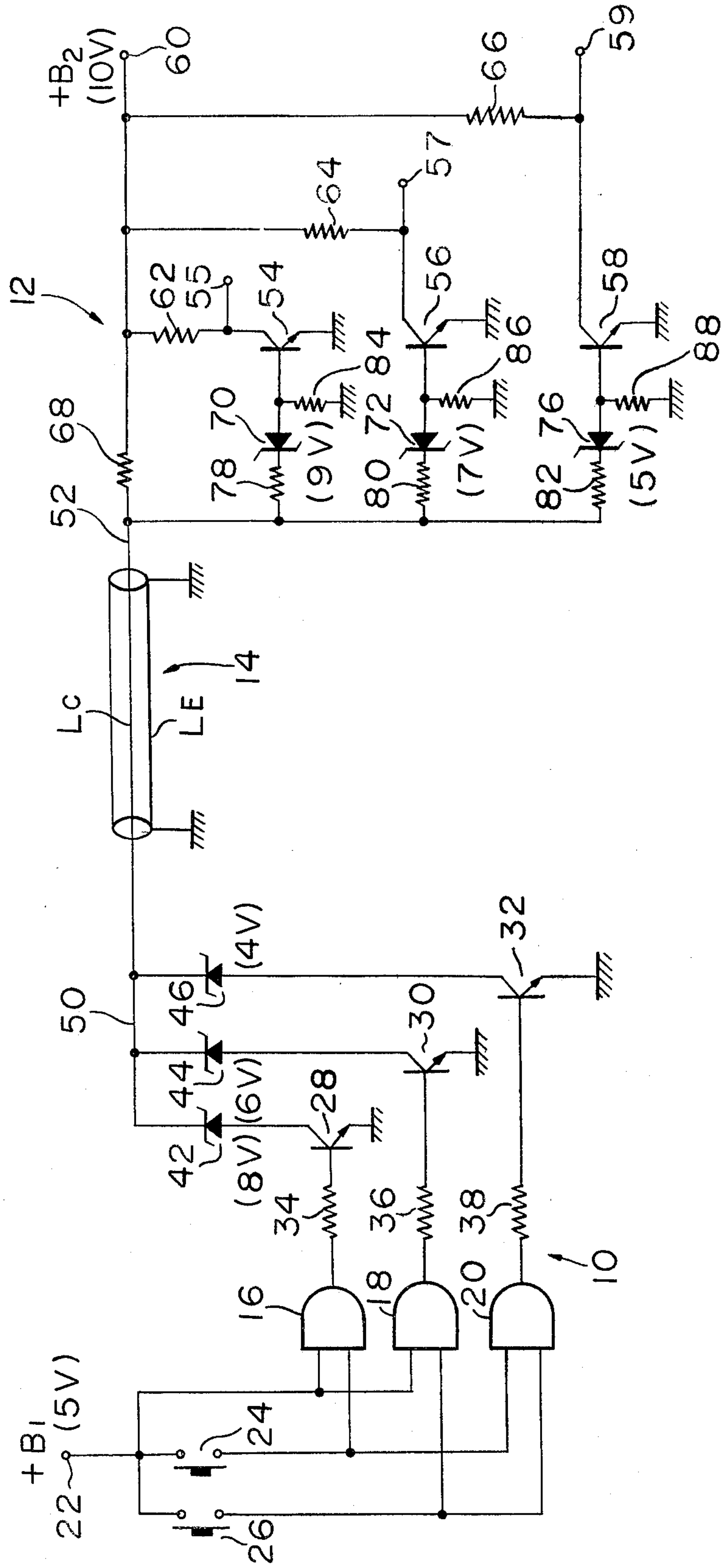
FIG. 1 shows a circuit diagram of the digital signal generating circuit embodied in accordance with this invention.

The control site 10 includes three two-input AND gates 16, 18 and 20. One input of the first AND gate 16 is connected to a $+B_1$ terminal 22 which receives TTL voltage level, for example +5 volts. Also, one input of the second AND gate 18 is coupled to the $B_1$ terminal. A first switch 24 is connected between the $+B_1$ terminal 22 and the other input of the first AND gate 16 and one input of the third AND gate 20. A second switch 26 is connected between the $°B_1$ terminal 22 and the other input of the second AND gate 18 which is coupled to the other input of the third AND gate 20.

The control site 10 also includes three switching mode NPN transistors 28, 30, 32 of which emitters are connected to the ground. The first transistor 28 has its base connected to the output of the first AND gate 16 through a resistor 34. The second transistor 30 has its base electrode connected to the output of the second AND gate 18 through a resistor 36. The third transistor 32 has its base connected to the output of the third AND gate 20 through a resistor 38.

A Zener diode 42 having the reverse breakdown voltage of 8 volts is connected between one side 50 of the D.C. carrying cable line LC and the collector of the first transistor 28. A second Zener diode 44 having the reverse breakdown voltage of 6 volts is connected to the terminal 50 and the collector of the second transistor. A third Zener diode 46 having the reverse breakdown voltage of 4 volts is connected between the cable terminal 50 and the collector of the third transistor 32.

The other end 52 of the D.C. carrying line LC of the cable 14 connecting the control site 14 to the remote conversion site 12 is connected to the conversion site 12. The conversion site 12 includes three switching mode NPN transistors 54, 56 and 58 of which collectors are connected to the respective output terminal 55, 57 and 59, and also to a $+B_2$ terminal 60 having +10 V voltage level through resistors 62, 64 and 66, respectively. The emitters of the transistors 54, 56 and 58 are grounded. The $+B_2$ terminal 60 is connected to the cable end 52 through a resistor 68.

There are provided in the conversion site 12 three Zener diodes 70, 72 and 76 of which cathodes are connected to the cable end 52 through resistors 78, 80 and 82, respectively. The first Zener diode 70 having 9 V reverse breakdown voltage has its anode connected to the base of the transistor 54 and to a resistor 84, the second Zener diode 72 with 7 V reverse breakdown voltage has its base connected to the base of the transistor 56 and a resistor 86, and the third Zener diode 76 with 5 V reverse breakdown voltage has its anode connected to the base of the transistor 58 and a resistor 88. The other ends of the resistor 84, 86 and 88 are grounded.

Although the switches 24 and 26 in the control site 10 are shown as mechanical switches in FIG. 1, they may be any types of switches, for example electric switches which may be controlled by the commands from a computer. These switches 24 and 26 establish four states of combination by their ON-OFF conditions.

The first state is the case where both of the switches 24 and 26 are off, that is, open. Then, all AND gates 16, 18 and 20 do not provide their outputs to the related switching transistors 28, 30 and 32, respectively.

Therefore, these transistors are all turned off. In this condition, the 10 V voltage at the terminal 60 in the conversion site 12 is transmitted through the resistor 68 and the D.C. carrying line LC to the cable end 50 in the control site 10. Upon this voltage level at the cable end 50 all of the Zener diodes 42, 44 and 46 do not at all affect, because the anodes of these Zener diodes are insulated by the related turned off transistors. Therefore, the voltage level of 10 volts at the terminal 60 exists at the cable end 52 in the conversion site 12 as it is. This voltage (10 V) is applied to the base circuit of the transistor 54 which includes the 9 V Zener diode 70, the base circuit of the transistor 56 including the 7 V Zener diode 72 and the base circuit of the transistor 58 including the 5 V Zener diode 76. The voltage level at the cable end 52 which is applied to these base circuits is higher than the reverse breakdown voltages of the Zener diode 70, 72 and 76, and, therefore the respective transistors 54, 56 and 58 are turned on at the same time. The turning on of the transistor 54 provides the low level to the output terminal 55, the turning on of the transistor 56 provides the low level to the output terminal 57, and the turning on of the transistor 58 provides the low level to the output terminal 59. That is, such first state generates in the conversion site 12 a digital output wherein all of the output terminals 55, 57 and 59 are low at the same time.

The second state is the case where one switch 24 is on or close and the other switch 26 off. At that time, only AND gate 16 provides its output to the related transistor 28 to make it turn on. Therefore, the Zener diode 42 with the 8 V reverse breakdown voltage is effectively grounded. This establishes +8 V potential at the cable end 50 in the control site 70, which is transmitted to the other end 52 in the converstion site 14 through the D.C. carrying line LC of the cable 14. This voltage level of 8 V is applied to the base circuits of the transistors 54, 56 and 58. It should be noted that this voltage level at the cable end 52 is higher than the reverse breakdown voltage of the Zener diode 72 (7 volts) in the base circuit of the transistor 56 and the reverse breakdown voltage of the Zener diode 76 (5 volts) in the base circuit of the transistor 58, but is lower than the reverse breakdown voltage of the Zener diode 70 (9 volts) in the base circuit of the transistor 54. Therefore, the transistors 56 and 58 are turned on, but the transistor 54 is turned off. This provides the high level to the output 55 and the low level to the output 57 and 59.

The third state is the case where the switch 24 is off but the switch 26 is on. At that time only AND gate 18 generates output to the transistor 30. Consequently, the transistor 30 turns on to connect the anode of the 6 V Zener diode 44 to the ground. This establishes 6 V voltage at the cable end 50 in the control site 10. This voltage potential is transmitted through the D.C. carrying cable line LC to the other end 52 in the conversion site 12 and applied to the base circuits of the transistors 54, 56 and 58. This potential is higher than the reverse breakdown voltage (4 V) of the Zener diode in the base circuit of the transistor 58, but is lower than the reverse breakdown voltages of the Zener diodes 72 and 70 (7 V and 9 V, respectively) in the base circuit of the transistors 56 and 54, respectively. Consequently, the transistor 58 is turned on but the transistors 54 and 56 are turned off. This produces a digital output from the conversion site 12 wherein the outputs 55 and 57 are the high level and the output 59 is the low level. The last state is the case where both the switches are made on. At that time, all the AND gates 16, 18 and 20 provide the outputs to the related transistors 28, 30 and 32, respectively. Therefore, these transistors turn on to connect the respective related Zener diodes 42, 44 and 46 to the ground. It should be understood that in such parallel connection of the Zener diode only the Zener diode with the lowest breakdown voltage, that is the Zener diode 46 having 4 V reverse breakdown voltage traps the applied voltage. Therefore, the cable end 50 in the control site 10 is trapped to 4 volts. This voltage is transmitted through the D.C. carrying cable line LC to the conversion site 12 in which this 4 V level is applied to the base circuits of the transistors 54, 56 and 58. This level is lower than the lowest reverse breakdown voltage (+5 V) of the diode 76, and, therefore it affects none of the base circuits of the transistors 54, 56 and 58. This state provides a conversion site output that three output terminals are the high level.

Figure 3:
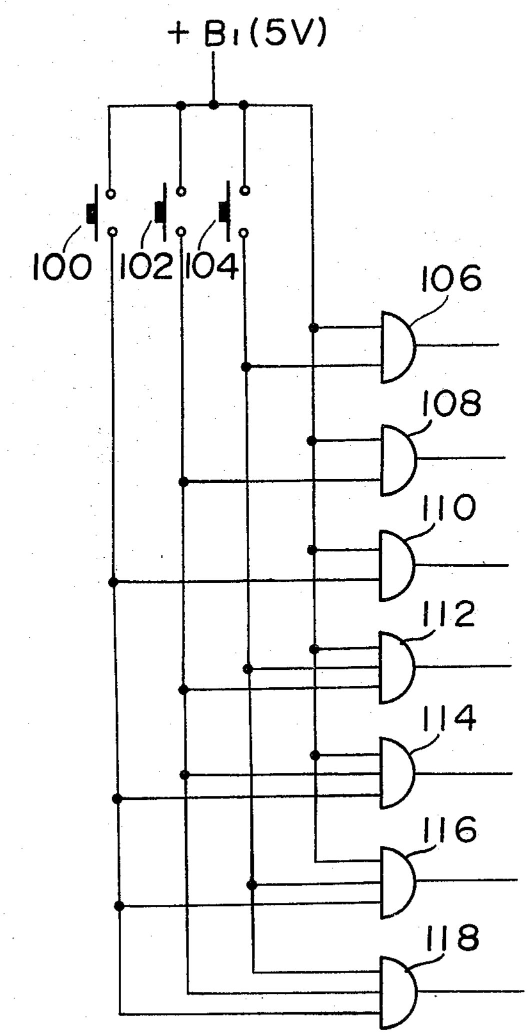
FIG. 3 is a circuit diagram of another embodiment of the control site of the digital signal generating circuit of this invention.

As is clear from the above-mentioned description, the embodiment shown in FIG. 1 can provide four different output signals in the conversion site 12 by using two switches. If three switches are used in combination with seven AND gates, eight different voltages can be generated at the cable end 50 using seven Zener diodes of different reverse breakdown voltages. FIG. 3 illustrates one such switch and AND gate combination. It includes three switches 100, 102 and 104, and three two-input AND gates 106, 108 and 110 and four three-input AND gates 112, 114, 116 and 118.

Figure 2:
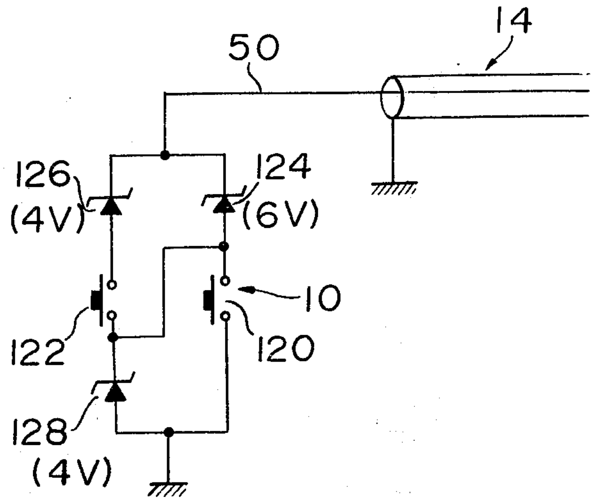
FIG. 2 shows a circuit diagram of an alternative embodiment of the control site of the digital signal generating circuit as illustrated in FIG. 1.

FIG. 2 shows another embodiment of the control site 10 which includes two switches 120 and 122. This arrangement provides four kinds of trap voltages (4 V, 6 V, 8 V and 10 V) at the cable end 50 without the use of the AND gates.

The control site 10 shown in FIG. 2 includes three Zener diodes 124, 126 and 128 having reverse breakdown voltages 6 V, 4 V and 4 V, respectively. The cathodes of the Zener diodes 124 and 126 are connected to the cable end 50. The anode of the Zener diode 124 is connected through the switch 120 the ground and connected directly to the cathode of the Zener diode 128. The anode of the Zener diode 126 is connected through switch 122 to the cathode of the Zener diode 128. The anode of the Zener diode 128 is grounded.

When two switches 120 and 122 are off or open, the Zener diodes 124 and 128 provide 10 V trap voltage at the cable end 50. When only the switch 122 is closed with the other switch 120 being opened, the Zener diodes 126 and 128 provide 8 V trap voltage at the cable end 50. 6 V trap voltage is applied by closing the switch 120 with the other switch 122 being opened. Lastly, when both switches 120 and 122 are depressed at the same time, although the Zener diodes 124 and 126 are made active, the 4 V trap is established at the cable end 50. Such trap voltages are transmitted through the two-wire cable 14 to the conversion site 12 and used therein in the same manner described previously with reference to FIG. 1.

We claim:

1. A signal transmission circuit comprising: control means for establishing a predetermined plurality of control conditions; analog signal generating means responsive to said control means for providing a plurality of trap voltages, each corresponding to one of said control conditions, by making a plurality of Zener diodes selectively active; two-wire cable means for receiving at one end thereof said trap voltages and transmitting the same; and digital signal generating means connected to the other end of said cable means for generating a predetermined digital signal in response to the level of each received trap voltage; each digital signal thereby corresponding to one of said control conditions.

2. A circuit as claimed in claim 1 further comprising means for applying a predetermined D.C. voltage from said digital signal generating means through said cable to said Zener diodes, said Zener diodes utilizing this D.C. voltage to establish said trap voltages.

3. A circuit as claimed in claim 2 and further comprising a plurality of binary signal generating units included in said digital signal generating means and each selectively responsive to the established trap voltage for providing one of two binary signal states.

4. A circuit as claimed in claim 1 wherein said digital signal generating means comprises a second plurality of Zener diodes, each arranged for conduction in response to at least one of said trap voltages, and a plurality of switching means, each responsive to one of said second plurality of Zener diodes for generating at least a portion of said digital signal.

5. A circuit as claimed in claim 4 and further comprising a D.C. voltage supply coupled to said first plurality of Zener diodes, to said second plurality of Zener diodes and to said switching means for use in establishing said trap voltage at both ends of said cable means and for use by said switching means in generating said digital signals.

6. A circuit as claimed in claim 4 wherein said switching means each comprise a switching mode transistor coupled to a source of D.C. voltage and responsive to the conductive or non-conductive state of the associated Zener diode for providing a binary logic signal comprising one of said D.C. supply voltage and a ground potential.

7. A signal transmission circuit comprising: control means for establishing a predetermined plural number of control signals; encoding means for selectively providing a plurality of voltage levels, each corresponding to one of said control signals; single conductor means for receiving and transmitting said plurality of voltage levels; and decoding means coupled with said single conductor for generating a corresponding digital signal in response to each of said voltage levels; whereby each said digital signal corresponds to one of said control signals.

8. A circuit as claimed in claim 7 wherein said encoding means comprises a plurality of Zener diodes, each responsive to one of said control signals for establishing trap voltage corresponding to one of said voltage levels.

9. A circuit as claimed in claim 8 wherein said decoding means comprises a second plurality of Zener diodes, each arranged for conduction in response to at least one of said trap voltages and binary signalling means responsive to each said second Zener diode for establishing one bit of said digital signal.

* * * * *